United States Patent [19]

Maysonett

[11] 4,099,245
[45] Jul. 4, 1978

[54] TRANSDUCER SIGNALLING APPARATUS

[75] Inventor: Anthony Maysonett, Fanwood, N.J.

[73] Assignee: Lockheed Electronics Co., Inc., Plainfield, N.J.

[21] Appl. No.: 794,073

[22] Filed: May 5, 1977

[51] Int. Cl.² .............................................. G06J 1/00
[52] U.S. Cl. ..................... 364/603; 340/347 SY; 364/724
[58] Field of Search ................. 235/150.5, 186, 189, 235/150.26, 150.27; 318/562, 605, 661; 340/347 SY, 347 SH, 147 R, 150

[56] References Cited
U.S. PATENT DOCUMENTS

| | | | |
|---|---|---|---|
| 3,493,960 | 2/1970 | Doyle | 340/347 SY |
| 3,508,252 | 4/1970 | Van Blarcom | 340/347 SY |
| 3,720,866 | 3/1973 | Avellar et al. | 235/189 X |
| 3,976,869 | 8/1976 | Stella et al. | 235/189 |
| 4,019,032 | 4/1977 | McDevitt | 235/150.5 |

*Primary Examiner*—Joseph F. Ruggiero

[57] ABSTRACT

A system for accumulating and processing data derived from plural transducers, such as an array of shaft position-measuring resolvers and/or other monitored parameters, includes multiplexing apparatus for converging the outputs of the transducers and the like upon sample-and-hold circuits and an analog-to-digital converter. The digitized signals are operated on by a reference signal in a synchronous demodulator, smoothed in a recursive digital filter operative in conjunction with the stored contents of a read/write memory (RAM), and stored in prescribed memory cells.

7 Claims, 1 Drawing Figure

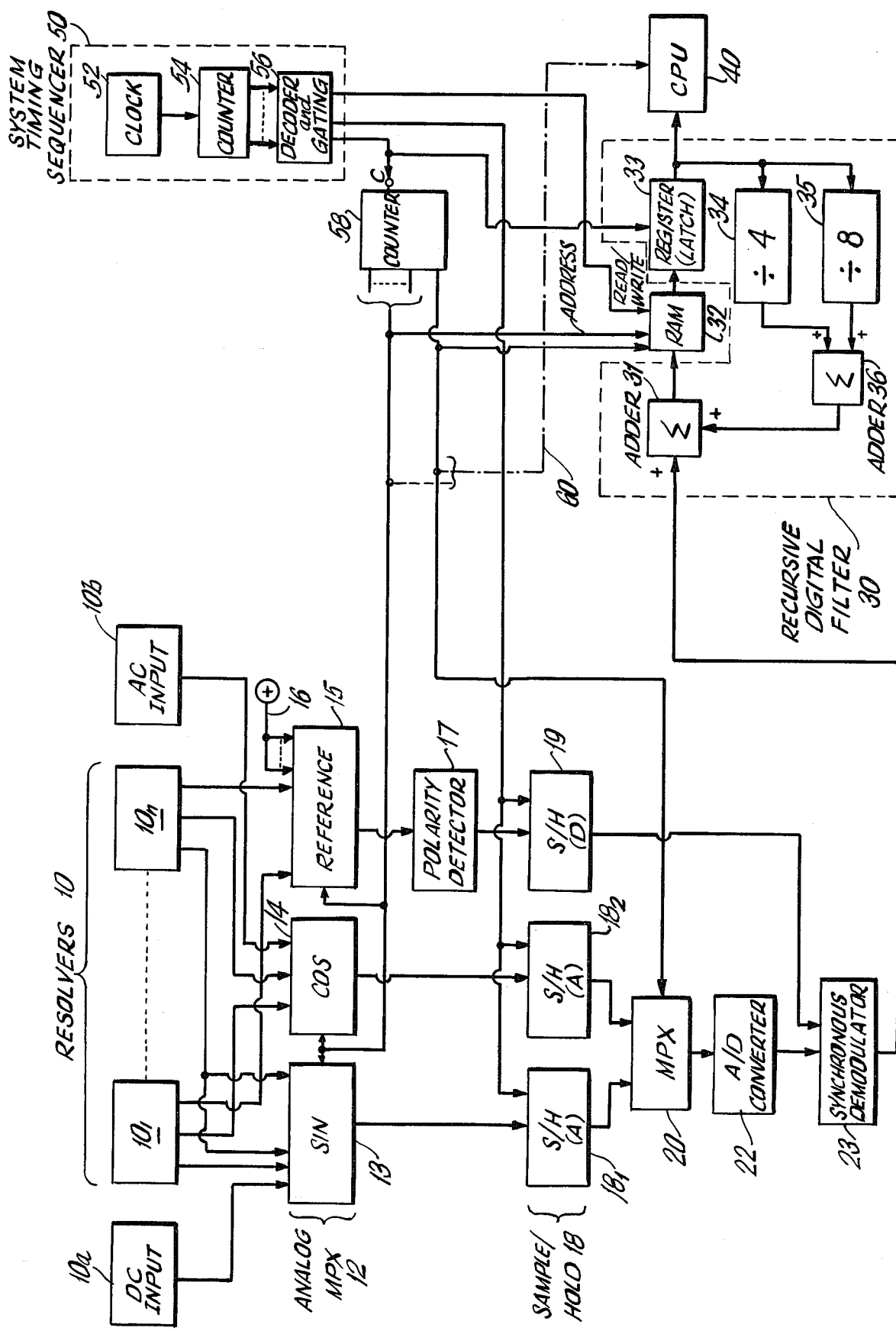

TRANSDUCER SIGNALLING APPARATUS

DISCLOSURE OF INVENTION

This invention relates generally to electronic instrumentation and control and, more specfically, to electronic data collection and processing systems.

Angular (and other) position-sensing transducers, such as resolvers, are in widespread use to determine the position of a shaft or body. For example, resolvers are commonly employed in weapons/radar systems to provide data concerning the rotational position of radar antenna, gun mounts, vehicle attitude, weapon position and the like. Such information is then processed to control the position of associated equipment.

The output of a resolver includes a pair of analog electrical signals (amplitude modulated sinusoids) corresponding to the sine and cosine of angular displacement, and a reference wave. Since most systems now process data in binary form, it is often necessary that the resolver output signals be converted into binary form for subsequent data processing and utilization.

When the rotational angles of several shafts are being measured at the same time, such as in weapons/guidance systems, the binary processing of a plurality of resolver output signals has heretofore generally required the use of complex and costly equipment (typically employed on a per signal basis), which has resulted in relatively high system costs and complexity and unreliability of operation.

It is an object of the present invention to provide a system for reliably and effectively processing the outputs of a plurality of transducers.

It is a further object of the invention to provide a system for processing in binary form the analog outputs of a plurality of angular position transducers, such as a resolver or the like.

It is yet another object of the present invention to provide an improved multiplexing/analog-to-digital conversion system to communicate plural diverse electrical signals to a central processing unit (digital processor).

In the system of the present invention, the sine and cosine outputs of the resolvers, as well as the outputs of any other transducer employed, are sequentially applied to sample-and-hold circuits in which the instantaneous values of these signals are sampled and stored. The signals stored in the sample-and-hold circuits, in turn, are sequentially applied to an analog-to-digital converter and a synchronous demodulator, the binary outputs of which are applied to a data-smoothing recursive digital filter. The filter operates in conjunction with the stored content of a data storing memory to remove transients and other error perturbations from the monitored signals. The refined, updated sensed parameter is then stored in memory.

To the accomplishment of the above and further objects as may hereinafter appear, the invention relates to a transducer data processing system as defined in the appended claims and as described in the following detailed specification as considered with the accompanying drawing in which the signal FIG. is a schematic block diagram of an embodiment of the system of the invention.

The system illustrated in the drawing receives position data from a plurality of transducers, herein shown as a plurality of resolvers $10_1$ to $10_n$ and, for purposes of generality, any D.C. and A.C. signal source (s) $10a$ $10b$ analog or digital. It is the fundamental purposes of the instant system to separately process all signals emanating from each signal source 10 (including the multiple outputs of a single resolver or the like), and to store a filtered digital measurement for each signal in a prescribed address in a digital read/write memory (RAM) 32. A single common, recursive digital filter 30 is employed for date smoothing and operates for each signal variable processed in accordance with the last-measured signal's supposed present amplitude and its last stored signal value supplied by the RAM 32 for computing and storing an updated value of the measured parameter. The apparatus may thus be utilized to couple an ensemble of signals, arbitrarily large and of any diverse type, to a computer memory to control a monitored environment.

As is per se well known, a resolver supplies three output sinusoidal waves of like frequency, two of which have amplitudes proportional to the sine and cosine of the angular position of the monitored shaft. The third or reference resolver winding furnishes a signal which resolves quadrant I-III and II-IV ambiguities. The array of resolver outputs are applied to the inputs of an analog multiplexer, generally designated 12, of any conventional form, e.g. binary address signal gated FET analog switches having a common output. More specifically, the sine outputs of the resolvers 10 are applied to the inputs of a conceptual "sine" multiplexer portion 13 and the cosine outputs of the resolvers 10 are applied to the inputs of a "cosine" multiplexer 14. The reference signals of the resolvers, which indicate the phase of the resolver outputs, are applied to the inputs of a reference signal multiplexer 15.

If desired, and as shown, the system of the invention may also process signals from additional transducers or other electrical signal sources, generically shown as a D.C. input source 10A and an A.C. input source $10b$, which have their outputs respectively applied as additional inputs to the sine and cosine multiplexers 13 and 14. A fixed reference signal 16 is applied to reference multiplexer 15 for these additional inputs to multiplexers 13 and 14 to pass such signals unchanged through the synchronous demodulator 23.

The outputs of sine and cosine multiplexers 13 and 14 are respectively applied to sample-and-hold circuits $18_1$ and $18_2$, and the output of reference multiplexer 15 is applied to a polarity detector 17 (e.g., a saturatable switching amplifier stage or zero biased comparator), the output of which is coupled to a reference signal sample-and-hold circuit 19. The address (i.e., input selector) signals that control the switching operations of multiplexers 13, 14 and 15 are derived from a sequencer 50 (or CPU 40) which is described in more detail below.

The instantaneous values of the several sine, cosine, and reference signals are periodically sampled and are stored in circuits $18_1$, $18_2$ and 19, respectively. The outputs of sample-and-hold circuits $18_1$ and $18_2$, which also receive a control signal from the sequencer 50, are sequentially fed to a multiplexer 20 which, in turn, serially applies the sine and cosine signals to the input of an analog-to-digital converter 22.

The output of converter 22, which represents the transducer (e.g. resolver) or other output signals in binary form, is applied to a synchronous demodulator (e.g., multiplier) 23, which also receives a binary "1" or "0" signal from the reference sample-and-hold circuit 19 in accordance with the phase or polarity (+) or (−) of the reference signal. In particular, as is per se well known for resolver signal processing, a (+) reference signal leaves the output of A/D converter 22 unchanged; a (−) reference signal causes negation of the converter 22 output. The operation of this binary reference signal on the cosine and sine signals in demodulator 23 is in essence that of digital multiplication, or full-wave rectification in that both negative and positive portions of the transducer outputs are effectively utilized in the demodulator to derive the binary transducer signals. If desired, the reference signal may operate on the sine and cosine signals only in the positive (or negative) part of the reference signal cycle (multiplication by "1" and "0" [simple gating] rather than "1" and "-1"), which would result in an effective half-wave rectification of the sine and cosine signals. Full-wave rectification has the advantage of fully utilizing the available information, thus lowering error rate.

The output of the demodulator 23 is applied to a common recursive digital filter, generally designated 30. The filter performs a smoothing operation on the demodulated output signal to remove noise, transients or other erroneous perturbations that may have been introduced into the transducer outputs. In overall scope, the composite filter operates by adding a portion (k) of last-stored value of any parameter to its presently computed value. At steady state, the stored parameter will be 1/(1−k) times the incoming signal, with a data smoothing time constant dependent upon the factor $k$ and the sampling rate.

The filter 30 comprises an adder 31 which receives as a first input the output of demodulator 23. The output of adder 31 is applied to the "write" intput of a random-access memory (RAM) 32. Data from the memory 32 is stored in a register or latch 33 and the output of the latter is applied to a divide-by-four circuit 34 (e.g., by a simple two place right shift) and to a divide-by-eight circuit 35, the outputs of which are combined in a second adder 36 (for an assumed $k$ factor of 0.375). The adders 31 and 36 may obviously be combined. The output of adder 36 is applied to the second input of adder 31, such that the output of adder 31 is the sum of the input (last measured) binary signal to which is added a fraction of the signal read out from memory 32. This composite output of adder 31 is then stored at the same address previously integrated in RAM 32.

The effect of this feedback and iteration is to filter out and remove spurious transient data from the signals being processed by minimizng system response to isolated pieces of bad data. The filtered binary signals are applied to a central processing unit (CPU) 40, where the information is processed in a known manner to compute the angular positions of the various resolvers (as by arc tangent or cotangental algorithms), as well as developing any control signals necessary or appropriate for the particular application, based upon the obtaining parameter values.

The operation of the multiplexers, sampling, and other circuits described above is controlled by timing pulses generated by a system timing sequencer, generally designated 50, embodiments of which are well known to those skilled in the art. Sequencer 50 shown includes a clock oscillator 52, which produces pulses at a predetermined rate which are applied to a counter 54. Counter 54 counts the clock pulses, and its outputs are applied to decoder and gating circuitry 56 (typically, simply an array of coincidence gates). In the manner long known per se, the decoding gates produce a cyclically recurring control pulse pattern at their plural outputs. Each output of circuit 56 is simply enabled for one or more predetermined states of the cyclic output of counter 54.

A decoder 54 output is supplied to the count input of a counter 58, which supplies address (input selection) signals to the multiplexer 13, 14, and 15, and to the address line of memory 32. The least significant bit of the output of counter 58 is furnished as address information to RAM 32, and also to multiplexer 20 to sequentially apply the sine and cosine signals to the analog-to-digital converter 22 during sampling of any single resolver.

Gating circuit 56 also provides a gating control signal to latches 18, 19 and 33, and a read/write control signal to memory 32. The appropriate control, timing, and address signals are also applied on a line 60 to processing unit 40 to apprise the unit 40 which variable is being communicated thereto by the latch 33. Alternatively, all timing and control signals may be provided by the CPU 40 to the system.

It will thus be appreciated from the foregoing description of an embodiment of the invention that signals obtained from a plurality of transducers or other signal sources may be accurately processed in a reliable manner. Although the system is shown as operating on the output of a plurality of resolvers, it may be employed to equal advantage with other transducers or other signal generators as indicated in the foregoing specification.

The above-described arrangement is merely illustrative of the principles of the present invention. Many variations and ramifications thereof will be readily apparent to those skilled in the art without departing from the principles of the present invention.

What is claimed is:

1. In combination, a plurality of signal sources including at least one resolver supplying sine, cosine and reference signals, an analog-to-digital converter, multiplexing and sampling means for serially and separately supplying each signal supplied by said signal sources to said analog-to-digital converter, memory means, and digital filter means connecting said analog-to-digital converter and said memory means.

2. A combination as in claim 1 wherein said multiplexing and sampling means comprises cascaded sine and cosine multiplexing means and sine and cosine sample and hold means for receiving the sine and cosine outputs of each of said resolvers.

3. A combination as in claim 1 wherein said digital filter means comprises means for receiving a stored value of a signal being processed from said memory means, combining means for linearly combining a measure of said received stored signal with the corresponding signal supplied by said analog-to-digital converter, and means for storing the output of said combining means in said memory means.

4. A combination as in claim 3 further comprising timing means for supplying addressing signals to said multiplexing and sampling means and to said memory means.

5. A combination as in claim 1 further comprising resolver output synchronous demodulating means connected intermediate said analog-to-digital converter and said common digital filter means.

6. A combination as in claim 1 further comprising timing means connected to said multiplexing and sampling means and to said common digital filter means.

7. A combination as in claim 1, further comprising timing means for supplying addressing signals to said multiplexing and sampling means and to said memory means, and resolver output synchronous demodulating means connected intermediate said analog-to-digital converter and said digital filter means, and wherein said common digital filter means comprises means for receiving a stored value of a signal being processed from said memory means, combining means for linearly combining a measure of said stored received signal with the corresponding signal supplied by said analog-to-digital converter, and means for storing the output of said combining means in said memory means.

* * * * *